(12) United States Patent
Moore et al.

(10) Patent No.: US 8,189,970 B2
(45) Date of Patent: May 29, 2012

(54) LIGHT COLLECTING AND EMITTING APPARATUS, METHOD, AND APPLICATIONS

(75) Inventors: Duncan Moore, Fairport, NY (US); Greg Schmidt, Gates, NY (US); Blair L. Unger, Rochester, NY (US); Michael Brown, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 13/108,225

(22) Filed: May 16, 2011

(65) Prior Publication Data

US 2011/0217013 A1   Sep. 8, 2011

Related U.S. Application Data

(63) Continuation-in-part of application No. 12/490,417, filed on Jun. 24, 2009.

(51) Int. Cl.
  *G02B 6/26* (2006.01)
  *H01L 31/052* (2006.01)
(52) U.S. Cl. ............... 385/33; 136/246; 385/146
(58) Field of Classification Search ............ 136/246; 385/33
  See application file for complete search history.

(56) References Cited

U.S. PATENT DOCUMENTS

| | | | | |
|---|---|---|---|---|
| 7,817,885 | B1 * | 10/2010 | Moore et al. | 385/33 |
| 2009/0067784 | A1 * | 3/2009 | Ghosh et al. | 385/33 |
| 2010/0108124 | A1 * | 5/2010 | Knox et al. | 136/246 |
| 2010/0224231 | A1 * | 9/2010 | Hoke | 136/246 |
| 2010/0278480 | A1 * | 11/2010 | Vasylyev | 385/33 |
| 2011/0162699 | A1 * | 7/2011 | Shappir et al. | 136/255 |
| 2011/0162713 | A1 * | 7/2011 | Morgan | 136/259 |
| 2011/0203662 | A1 * | 8/2011 | Miano et al. | 136/259 |

* cited by examiner

*Primary Examiner* — Eric Wong
(74) *Attorney, Agent, or Firm* — William Greener; Bond, Schoeneck & King, PLLC

(57) ABSTRACT

A light guide apparatus includes a light guide layer having a top surface and a bottom surface, and a transversely oriented side-end surface that forms an output aperture of the light guide, characterized by an index of refraction, $n_1$, and further characterized by a length dimension in an intended light propagation direction towards the output aperture, where the intended light propagation direction is a z-axis direction of a Cartesian coordinate system; and a plurality of light injection elements disposed in the form of at least one linear strip in at least one of the top and bottom surfaces of the light guide layer, wherein some of the plurality of light injection elements are disposed on one lateral side of the strip and some other of the plurality of light injection elements are disposed on an opposing lateral side of the strip, further wherein each light injection element is disposed outwardly at a rotation angle $\Delta z$ about the y-axis.

14 Claims, 17 Drawing Sheets

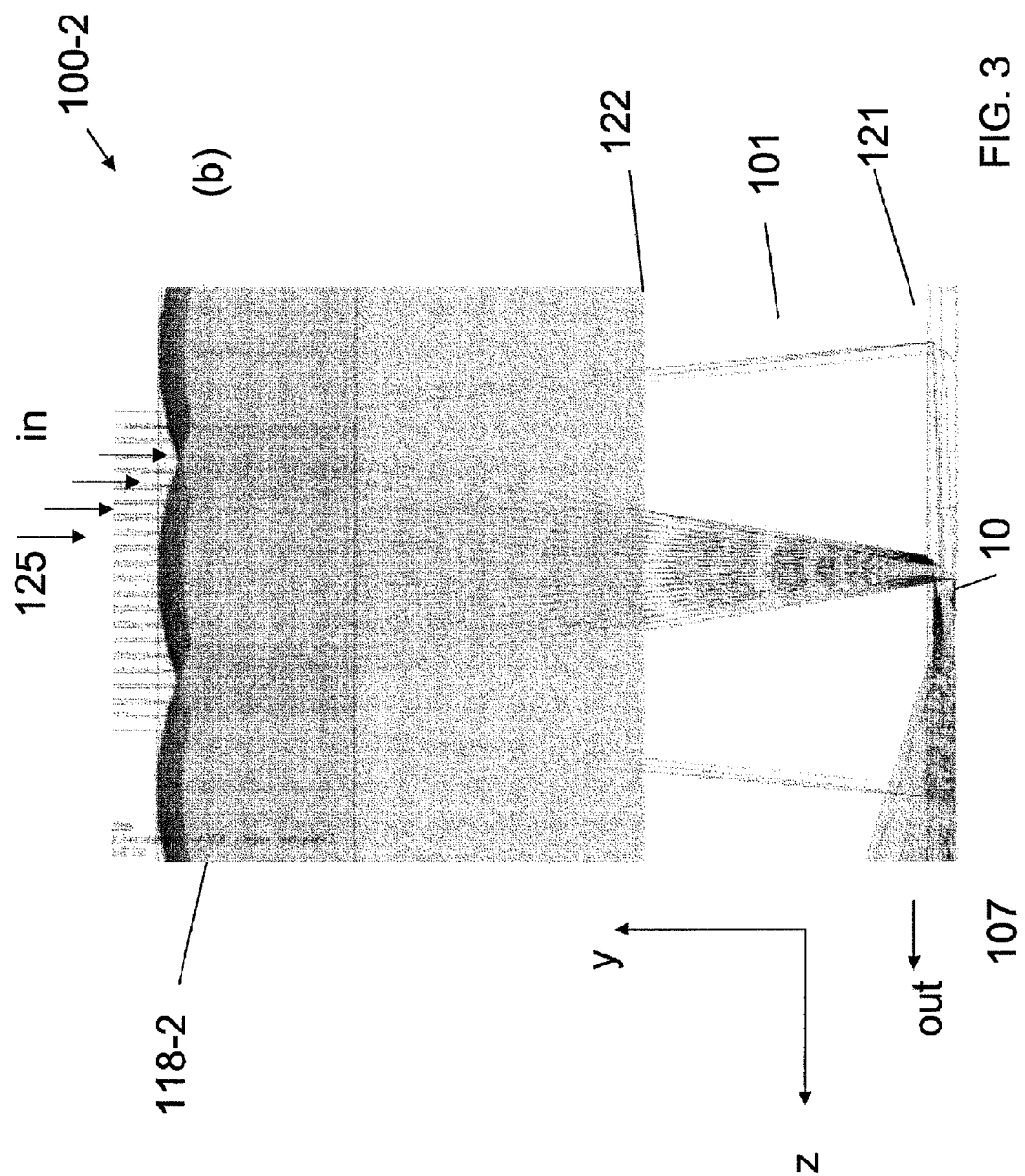

LIGHT COLLECTING AND EMITTING APPARATUS, METHOD, AND APPLICATIONS

CROSS-REFERENCE TO RELATED APPLICATIONS

This application is a continuation-in-part application of U.S. Ser. No. 12/490,417 filed on Jun. 24, 2009, the disclosure of which is incorporated by reference herein in its entirety.

GOVERNMENT SPONSORSHIP

N/A.

BACKGROUND OF THE INVENTION

1. Field of the Invention

Embodiments of the invention relate generally to the field of optical light guides and, more particularly, to non-imaging, light collecting and emitting apparatus, methods, and applications. Even more particularly, embodiments of the invention relate to a light collection apparatus and light guide for use in a concentrated photovoltaic (CPV) solar energy system, as a light emitting apparatus, and other applications.

2. Related Art

Solar energy is an important part of the renewable energy solution. Concentrated photovoltaics (CPV) have the potential to provide a source of cost effective and clean energy. By concentrating solar energy with optics, less photovoltaic (PV) material is used, reducing cost, since PVs are expensive and energy-intensive to produce compared with optical components.

FIG. 1 illustrates the general construction of a planar light guide system as described in the related art in relation to a standard reference coordinate system. Incident light 1 from a distant, extended source (e.g., solar radiation) propagating generally in the (−)y direction is concentrated (e.g., light 2) by a lens 3 and injected into the light guide 4 via a light injection element 5 on or in the face of the guide. The light thereafter propagates generally in the z-direction towards an exit end (edge) 6 of the light guide. The discrete light injection element 5 is a surface portion of the light guide apparatus that may be made by a partial transverse lateral cut extending from a region of the bottom surface 7 of the light guide. Depending upon the tilt angle of the light injection element, the index of refraction of the light guide, and the index of refraction of the external interface of the injection surface, radiation may be totally internally reflected from the face of the light injection element.

In CPV applications, a general object of the system is to collect as much solar radiation as possible and concentrate that radiation as much as possible for input to a PV cell located at an output edge of the apparatus. The presence of the light injection elements results in a non-ideal light guide since light propagation through the transport structure is hindered by interactions with downstream light injection elements. Light loss can occur by absorption or scattering at a light injection element, out-coupling of light at a light injection element, or étendue dilution from interaction with a light injection element. Further system objectives include maximizing primary concentrator acceptance angle, maximizing injection concentration, maximizing light guide concentration, and minimizing component and system weights and thicknesses.

The inventors have recognized the benefits and advantages of a light collecting apparatus for use in a CPV system that is more efficient, lower in cost, higher performing, and easier to manufacture than previous apparatus, and an apparatus that can collect and emit light for lighting applications.

SUMMARY

An embodiment of the invention is a light guide apparatus. The light guide apparatus includes a light guide layer having a top surface and a bottom surface, at least one of which is a substantially planar surface, and a transversely oriented side-end surface that forms an output aperture of the light guide, characterized by an index of refraction, $n_1$, and further characterized by a length dimension in an intended light propagation direction towards the output aperture, where the intended light propagation direction is a z-axis direction of a Cartesian coordinate system; and a plurality of light injection elements disposed in the form of at least one linear strip in at least one of the top and bottom surfaces of the light guide layer, wherein some of the plurality of light injection elements are disposed on one lateral side of the strip and some other of the plurality of light injection elements are disposed on an opposing lateral side of the strip, further wherein each light injection element is disposed outwardly at a rotation angle $\Delta z$ about the y-axis. In the detailed description that follows, each of the light injection elements may be referred to as 'dimples' or 'light injection facets' and the plurality of light injection elements may be referred to as the 'dimple layer' of the light guide. Each of the light injection elements ('dimples,' 'facets') is formed by a transverse cut into the surface of the light guide layer, which extends inwardly from the surface at an angle thereto, referred to as the injection angle. The space behind each facet may be air or a material having a lower index of refraction than that of the light guide layer into which the facet is formed. According to non-limiting aspects, the light guide apparatus includes a primary light concentrator array disposed adjacent the top or bottom surface of the light guide layer. The primary light concentrator array may be comprised of any of a variety of known optical elements that can collect incident solar radiation and concentrate this incident radiation into a smaller area (i.e., onto the face of an injection element). Refractive elements (e.g., lenses), reflective elements (e.g., mirrors), and diffractive elements (e.g., gratings, holograms) are non-limiting examples of primary light concentrator elements that may be used. According to various non-limiting aspects, a single primary light concentrator element may take the form of a conventional focusing lens, a Fresnel lens, a cylindrical lens, a parabolic mirror (or segment thereof), an angle-angle concentrator, and other optics known in the art. The primary light concentrator array may be in the form of a regular, linear array, an offset, segmented, tiled, or tessellated array, or other configuration in which each single element may have a perimeter shape that may be regular or irregular. Each single element of the component array will be optically registered with a respective facet in the light guide (i.e., will focus or otherwise concentrate incident light onto the reflecting face of a respective dimple). Since light propagation in the guide layer will primarily be by TIR, at least either the top or bottom surface of the guide layer will be bounded by a TIR medium having an index of refraction $n_2$ that is lower than the index of the guide layer material. The location of the lower index TIR medium immediately adjacent the top and/or bottom surface of the guide layer may depend on whether the dimple layer is the top or bottom surface of the light guide layer. According to the embodied invention, the dimple layer may be comprised of parallel strips of dimples, wherein each strip has a linear or repeating plurality of dimples on one lateral side and on the other lateral side of the strip. The dimples on opposing sides of the strip may be in an opposite-type configuration, for example, if the primary light concentrator array is regular and aligned or, the dimples on opposing sides of the strip may be in an alternate-type configuration, for example, if the primary light concentrator array is tiled, tessellated, or offset, as will be described in greater detail below. These dimple strip configurations may figuratively be thought of as having a 'Christmas-tree' shape in which the light propagation direction in the waveguide layer is from the tip to the base of the 'Christmas tree' (i.e., the z-direction). In each of the opposite-type or alternate-type configuration aspects, the reflecting face of each dimple will be outwardly offset in the x-y plane from the z-axis by a rotation angle $\Delta z$ such that the path of incident light reflected from each dimple and propagated down the waveguide layer in the z-direction does not intersect the next downstream dimple. The embodied light guide apparatus provides a means by which light that is for the most part normally incident (i.e., within an allowable acceptance angle) on the primary concentrator array, and concentrated by the primary concentrator elements, is input to and/or directed in a different, desired propagation direction in the light guide towards the output aperture of the light guide layer. Thus the light injection elements suitably function to capture the primary-concentrated light that is for the most part normally incident on the system and redirect it, illustratively, at 90 degrees (see FIG. 1), in order for it to propagate along the length (z-direction) of the light guide towards the exit-end thereof.

The light guide layer discussed above is in the form of a thin sheet waveguide, i.e., having a thickness, T, much less than the general length, L, of the structure and thus having a low aspect ratio defined by T/L. An optional secondary light concentrator may be provided, which serves to collect the light propagating in the low-aspect-ratio guide layer and further concentrate it for out-coupling through the exit-end of the guide layer and, advantageously, into a PV cell disposed to directly receive the out-coupled light. According to a non-limiting aspect, a secondary light concentrating optical component may be operatively coupled to (e.g., molded to, cemented to, free-space-aligned to, etc.) the exit-end of the light guide to secondarily concentrate and out-couple the light into the PV cell(s). The secondary concentrator may be made of the same or a different material than the guide layer. Alternatively, the exit-end itself of the guide layer may be shaped (e.g., parabolically-tapered; straight-tapered; trapezoidally-tapered; or, otherwise appropriately shaped) to integrally form the secondary concentrator in the exit-end of the guide layer. Such shapes will support all types of reflection (TIR and/or specular reflection and/or diffuse reflection) of the light propagating in the light guide.

Another embodiment of the invention is directed to a light collecting/emitting illumination apparatus. This embodiment is structurally similar to the above described embodiment in so far as the low aspect ratio planar form, the Christmas-tree dimple structured dimple layer, and the primary light concentrator array. According to the instant embodiment, a transverse edge face (i.e., the 'output' face in the above described embodiment) would be the input face of the apparatus. TIT-guided input light will be reflected by the dimples towards the primary optical component (lens, mirror, etc.) array and output from the top or bottom surface of the apparatus to provide, for example, architectural lighting.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 5 schematically shows an alternate-type configuration dimple strip of a light guide apparatus according to an exemplary aspect of the invention;

DETAILED DESCRIPTION

Reference will now be made in detail to the present exemplary embodiments of the invention, examples of which are illustrated in the accompanying drawings. Wherever possible, the same reference numbers will be used throughout the drawings to refer to the same or like parts.

Figure 2:
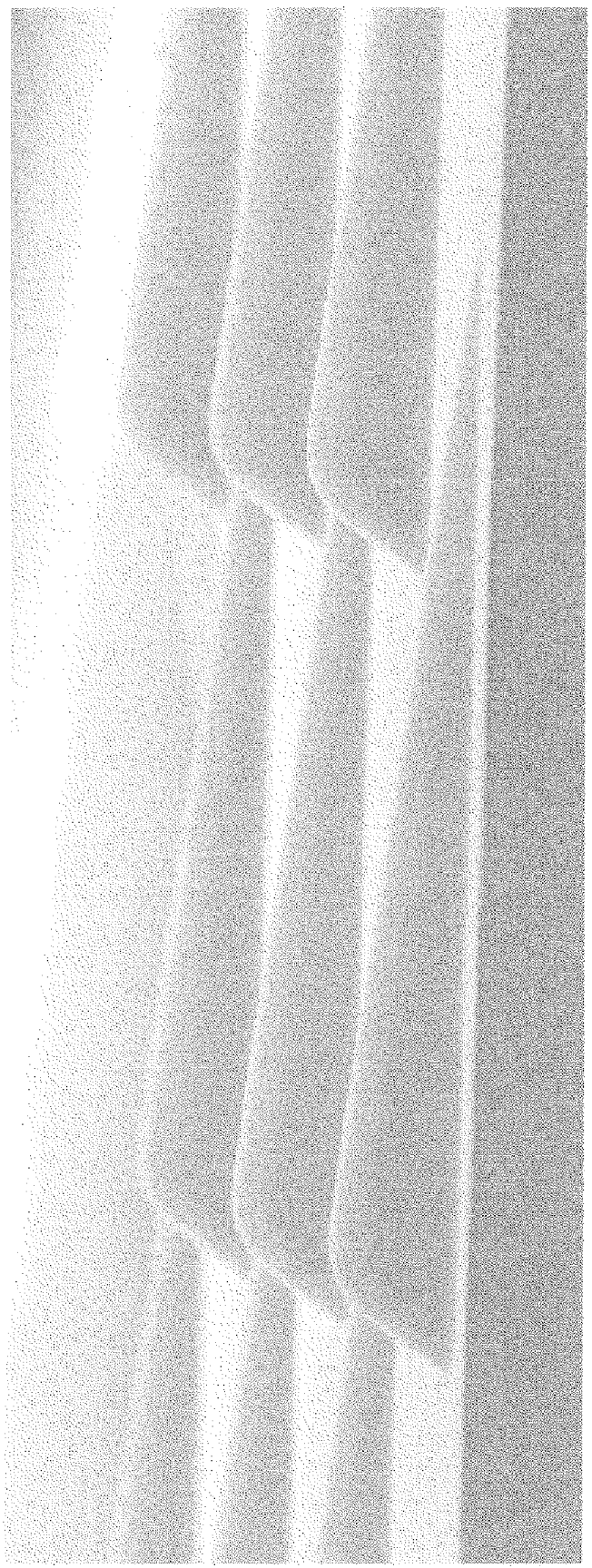
FIG. 2 is an electron microscope image of dimples of the light guide as disclosed in the parent application, according to an illustrative embodiment of that invention.

FIG. 2 is an electron microscope image of 'dimples' (each comprising a light injection element and an integrated bypass element or 'tail') of the light guide as disclosed in the parent application. Although this design is suited to light concentration of about 100× or less, the 'dimpled' light guide concept will benefit from an extension to a substantially higher concentration regime, to thus be competitive with alternative concentrator solutions. The embodiments described herein below allow for substantially higher concentrations, but continue to take into account the manufacturing considerations of the dimple design disclosed in the parent application.

A 'dimple' according to the instant light guide apparatus invention will be generally designated throughout by reference numeral 10, and refers to a structural configuration of the planar light guide in the form of an angled, transverse cut into the top or bottom layer of the light guide layer forming a facet (small, plane surface) as illustrated by reference numeral 10 in FIGS. 4(a) and 5. The facet cut into the light guide material medium having an index of refraction $n_1$ also has refractive index $n_1$. The facet may have a reflective coating and/or may be immediately adjacent a TIR medium having an index of refraction $n_2$ that is less than $n_1$.

Figure 1:
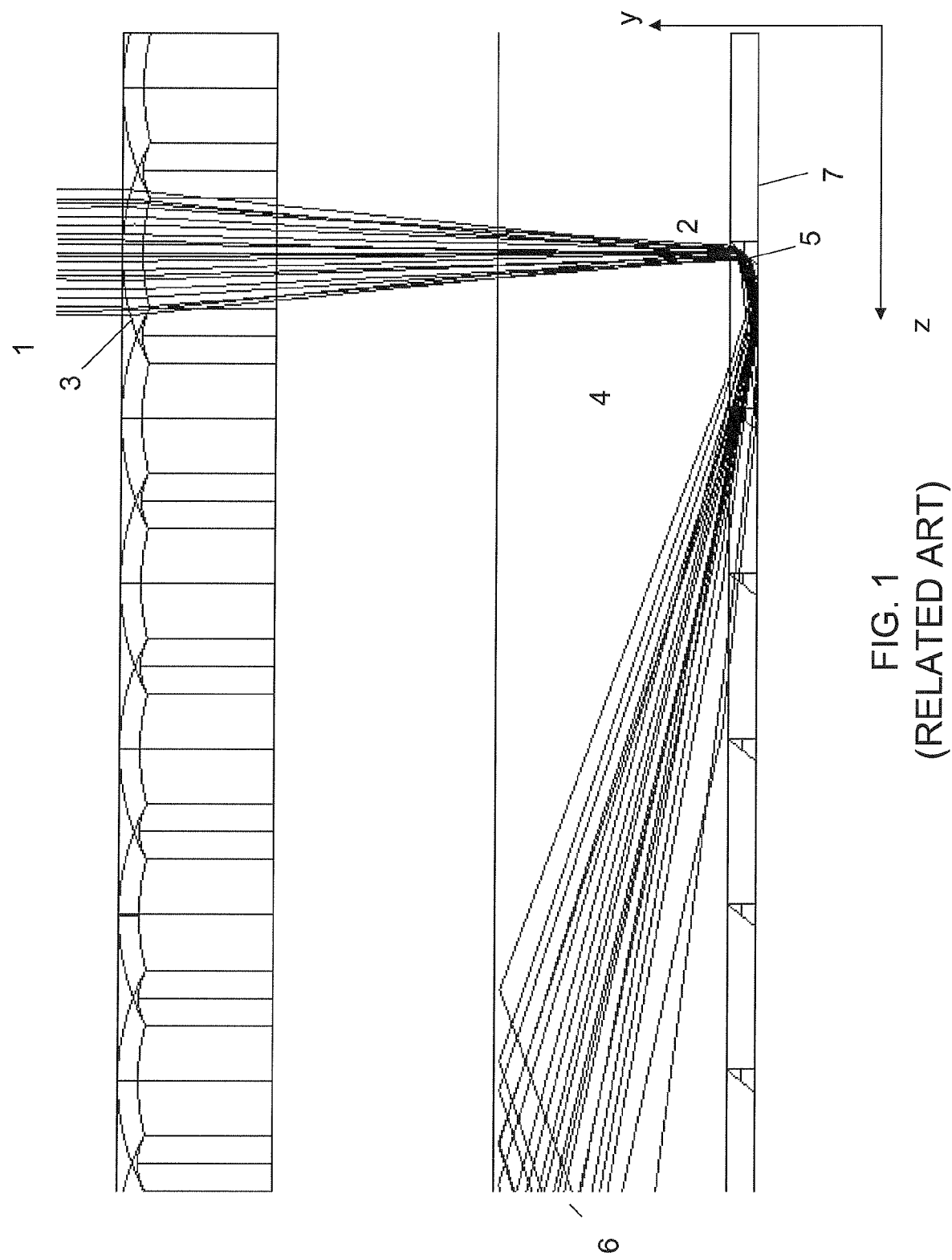
FIG. 1 schematically shows in cross section an illustrative planar light guide solar collection and concentration system with coordinate system according to the related art.
Figure 3:
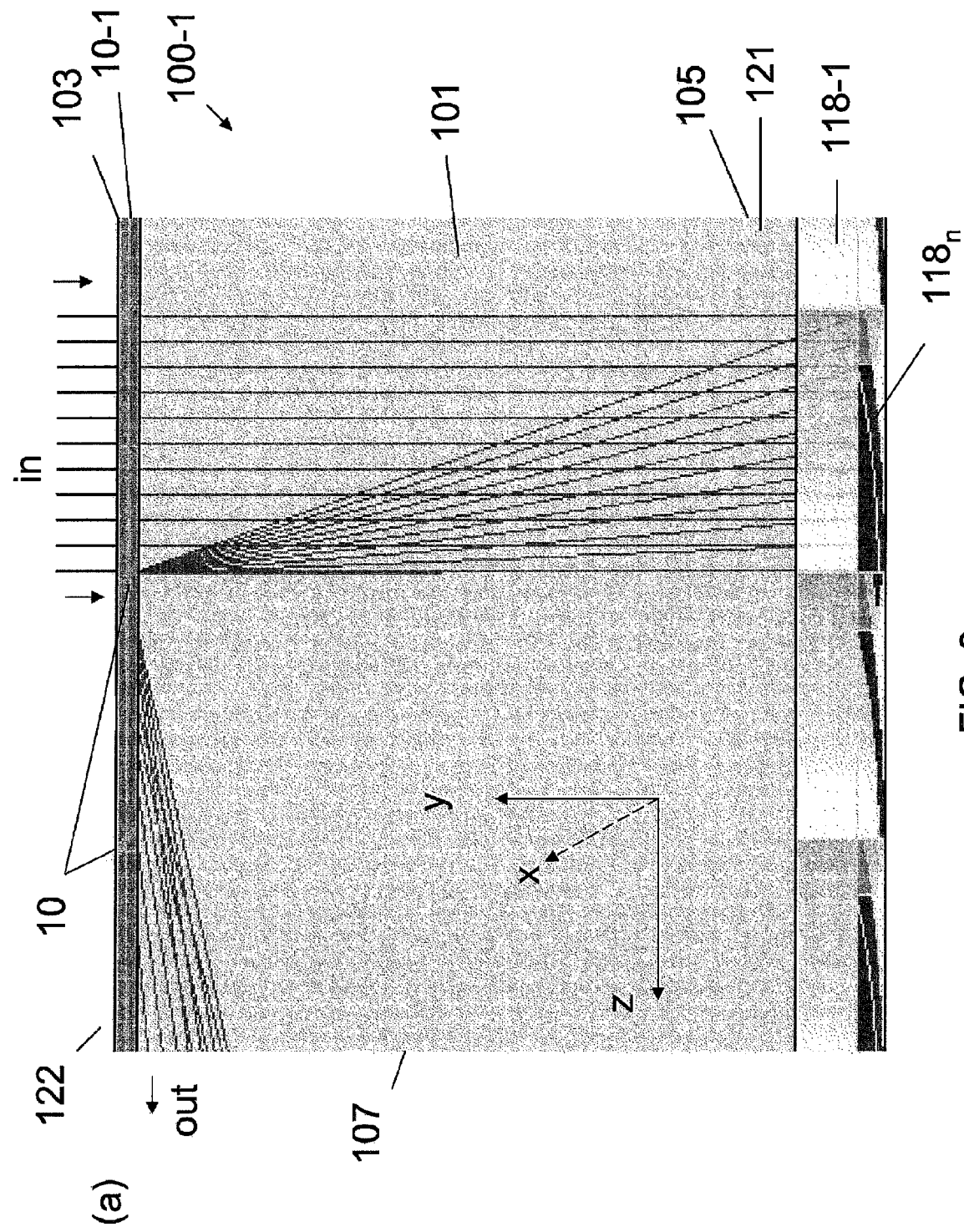
FIGS. 3(a, b) are schematic, cross sectional, elevation views of light guide apparatus according to alternative exemplary embodiments of the invention; a) reflective system; b) refractive system.

An exemplary reflective-type light guide apparatus 100-1 is illustrated in cross section in FIG. 3a. The light guide apparatus 100-1 in its basic form includes a light guide layer 101 having a top surface 103 and a bottom surface 105. At least one of the top and bottom surfaces is a substantially planar surface (both are planar as shown in FIG. 3a). The light guide layer 101 also has a transversely oriented side-end surface 107 that forms a output aperture of the light guide. The light guide layer is an optically transparent (transmissive) medium characterized by an index of refraction, $n_1$, and has a length dimension in an intended light propagation direction towards the output aperture 107, where the intended light propagation direction is a z-axis direction of a Cartesian coordinate system as shown superimposed in FIG. 3a. Non-limiting, exemplary light guide layer materials include NBAK-1 ($n_1 \sim 1.57$), borofloat ($n_1 \sim 1.47$), and others known in the art. The light guide layer also includes a plurality of light injection elements (dimples) 10 formed in the top surface 103 of the light guide layer, referred to as the dimple layer 10-1. The dimples may be oriented at an injection angle of about 45 degrees such that incident light general normal to the top surface of the light guide (i.e., the (−)y-direction) will be turned 90 degrees and propagate down the light guide in the z-direction, as illustrated in FIGS. 1 and 3.

To functionally operate as a solar light guide, the apparatus further includes a primary light concentrator array 118-1 comprised of concave mirror elements $118_n$, disposed adjacent the bottom surface 105 of the light guide layer 101. A low index TIR medium layer 121 having an index of refraction $n_2$ ($n_2 < n_1$) is disposed immediately adjacent the bottom surface of the light guide layer intermediate the bottom surface and the primary light concentrator array 118-1. Another low index TIR medium layer 122 having an index of refraction $n_3$ ($n_3 < n_1$) is disposed immediately adjacent the top surface 103 of the light guide layer. The low index layers facilitate propagation of light through the light guide layer along the z-axis direction by total internal reflection. The low index layers may be air or some other solid, liquid or gaseous medium satisfying the TIR condition. A cover medium (not shown) may be disposed adjacent the low index medium 122. Thus as illustrated in FIG. 3a, parallel rays of solar radiation 125 are incident on the top surface of the light guide layer in the generally (−) y direction (±acceptance angle), and travel transversely through the light guide layer to the primary concentrator array. Incident light reflected from each mirror element $118_n$ is concentrated or focused onto a respective light injection element 10 and reflected therefrom to propagate down the light guide layer in the z-direction towards the exit aperture 107 via TIR within the light guide layer.

A refractive system 100-2, according to an alternative exemplary embodiment is similarly illustrated in FIG. 3b, where the primary light concentrator array is composed of refractive lens elements and is disposed adjacent a top surface of the light guide layer. In the refractive system illustrated in FIG. 3b, solar radiation 125 is incident on the lens array 118-2, which focuses the incident light onto respective injection facets 10 disposed in the bottom surface of the light guide layer. The light is reflected from the facets and propagates via TIR down the waveguide layer.

In the exemplary aspect of the light guide apparatus 100-1 illustrated in FIG. 3a, the optical elements $118_n$ of the primary concentrator array 118-1 are parabolic reflectors. Parabolic reflectors may provide advantages over refracting elements such as, for example, no chromatic aberrations and thus a smaller focal spot on each injection facet. This allows the injection facets to be smaller and thus increases the guiding efficiency of the system. Although reflective elements may cause shadowing losses, a reflective primary concentrator array provides better guiding capability leading to superior performance at higher concentrations.

To maximize guiding efficiency, the cone of light produced by each concentrating/focusing element should be deflected directly down the guide, perpendicular to the angle of incidence. In a previously disclosed design, this corresponds to a 45° injection facet angle for a cone of light symmetric about an axis normal to the guide plane. The light to be injected into the guide must satisfy TIR, which limits the facet angle based on the numerical aperture of the focusing element and the index of the dimples as shown in the equation $$\theta_{inj} \leq 90° - \sin^{-1}(NA_{lenslet}) - \sin^{-1}(1/n)$$

For materials with an index of refraction of approximately 1.5, a 45° injection facet will only couple a small NA down the guide before TIR is no longer satisfied. Small input apertures of the focusing element require a high density of injection facets, and thus dramatically reduce guiding efficiency. Having an injection angle of less than 45° increases the angles with which the light travels down the guide, resulting in both more frequent dimple interactions and an increased light ejection rate.

Figure 4:
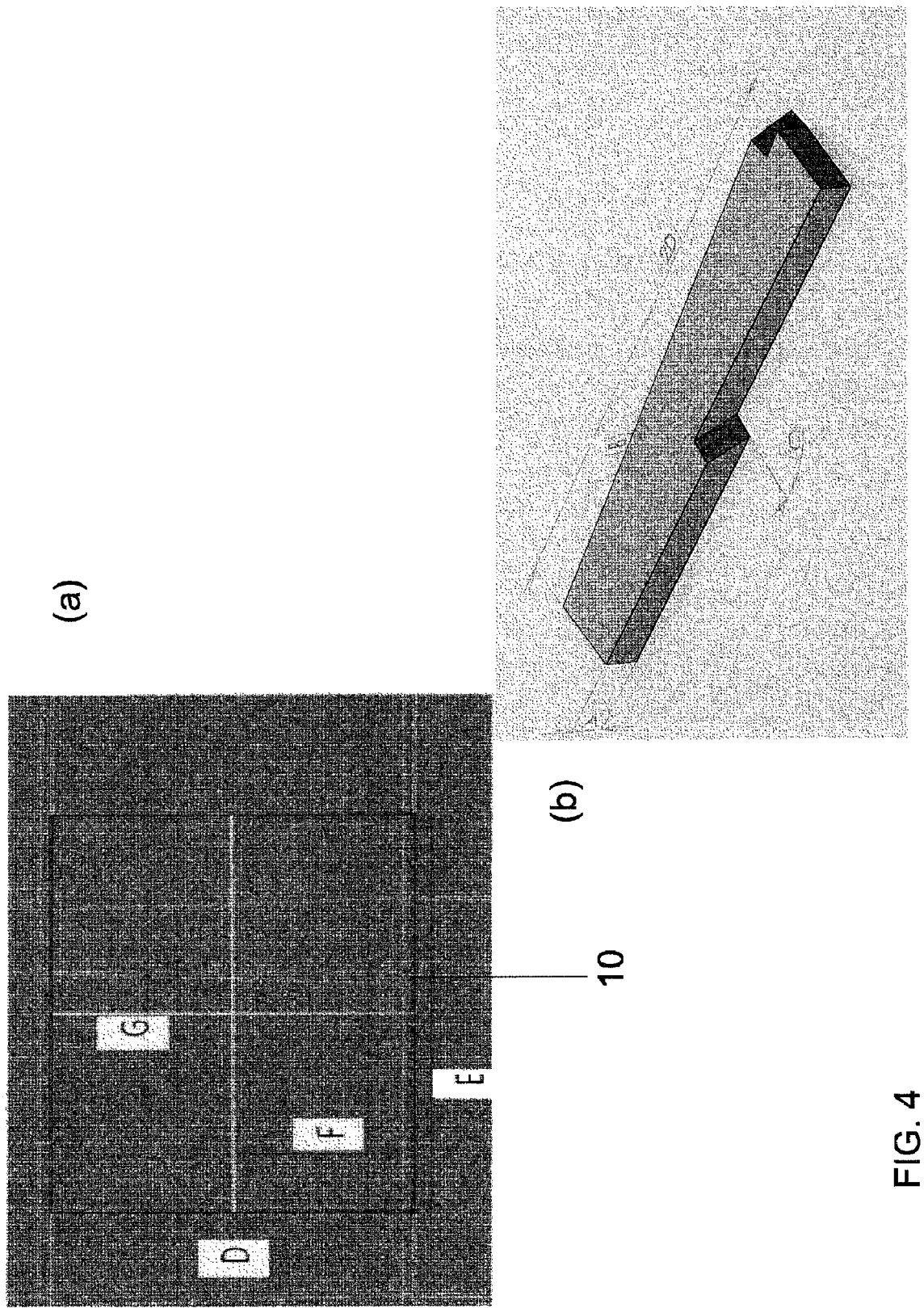
FIGS. 4(a, b), respectively, show a schematic line drawing of a primary light concentrator element and its physical relationship to a dimple strip, and a schematic perspective view of a dimple strip indication dimensional parameters, according to illustrative aspects of the invention.
Figure 5:
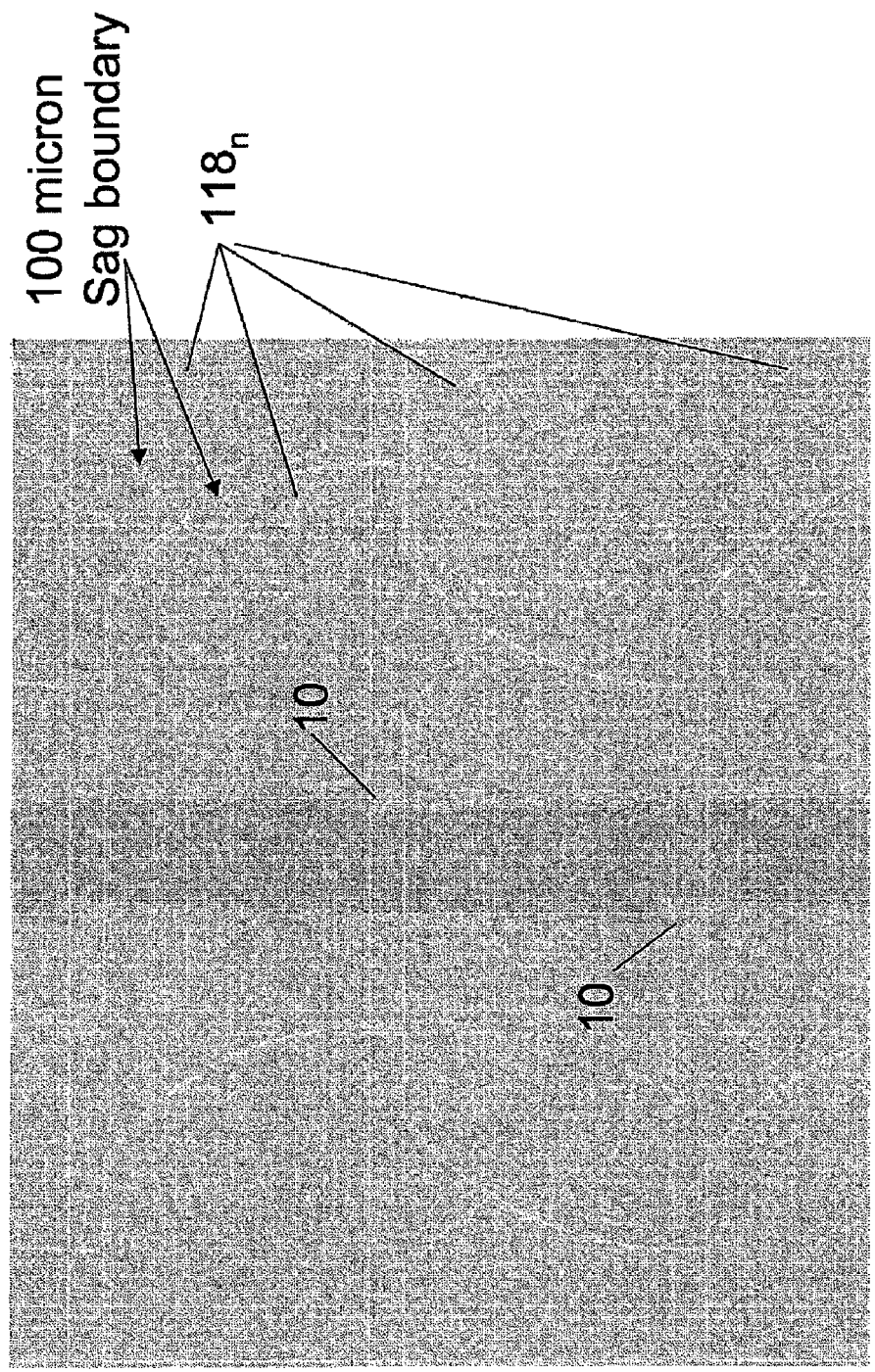
FIG. 5 is a schematic line drawing of the primary light concentrator array of FIG. Z, showing the alignment of each of the mirror elements with respective light injection facets, according to an illustrative aspect of the invention.
Figure 6:
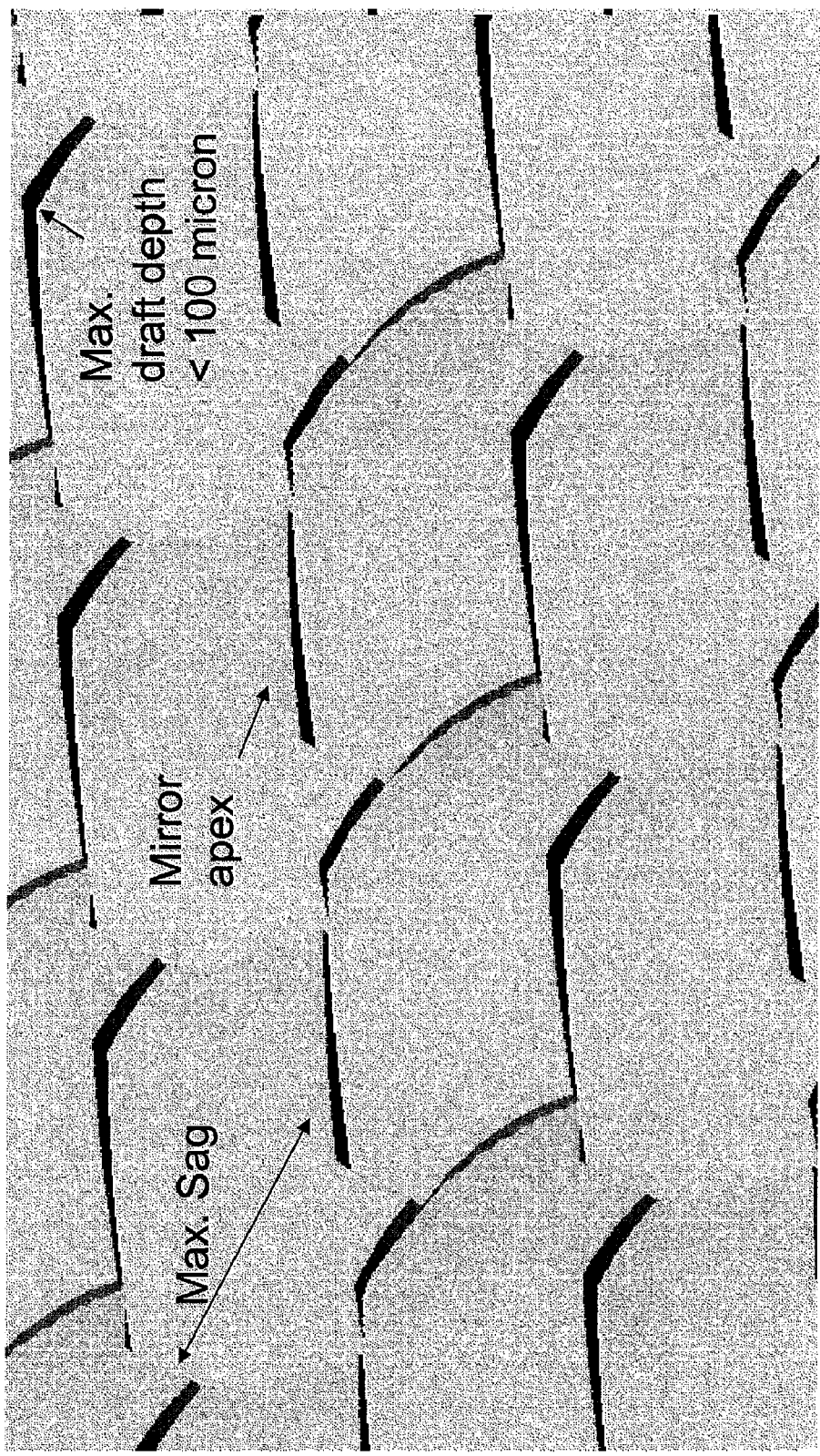
FIG. 6 is a schematic illustration of a tessellated, primary light concentrator array of parabolic mirrors having offset apertures, according to an illustrative aspect of the invention.

In the instant exemplary aspect, in order to achieve a larger input aperture while continuing to satisfy TIR at the injection facet, the mirror elements $118_n$ are offset such that their optical axes are no longer in the center of their input apertures, as shown in FIGS. 4(a), 5 and 6 (described further below). The offset geometry eliminates the rays with the highest incident angle on the injection facet, and thus will allow a larger input cone on each injection facet while still injecting the light along the guiding direction. This will also change the optimal injection angle to be greater than 45°, as the ray in the center of the injection cone is no longer perpendicular to the guide plane. An optimum injection angle was determined to be 46.5° based upon the exemplary apparatus parameters listed in Table 1, with reference to the parameters labeled in FIGS. 4(a, b). As illustrated in FIG. 4(a), the aperture of each focusing element was chosen to be rectangular so that the input numerical aperture could be optimized for both dimensions.

TABLE 1

| Parameter | A: Dimple Height | B: Injection Angle | C: Rotation Angle | D: Lens Extent (Guiding) | E: Lens Extent (Non-Guiding) | F: Lens Offset (Guiding) | G: Lens Offset (Non-Guiding) |
|---|---|---|---|---|---|---|---|
| Value | 72 μm | 46.5° | 8.0° | 0.85 mm | 1.62 mm | 0.36 mm | 0.2 mm |

FIG. 5 shows a tessellated primary mirror concentrator array 118-5, illustrated also in perspective view in FIG. 6. The mirror elements $118_n$ are offset parabolas, where the crossing horizontal and vertical white lines in FIG. 5 indicate each mirror's apex, which is aligned directly over a respective injection facet 10. The tessellated, offset parabolic minor array is further illustrated in FIG. 6. The seemingly odd, irregular mirror perimeter shape maximizes offset and the area for the 100μ sag over a less efficient faceted Fresnel minor, and improves coupling into the light guide layer.

Figure 7:
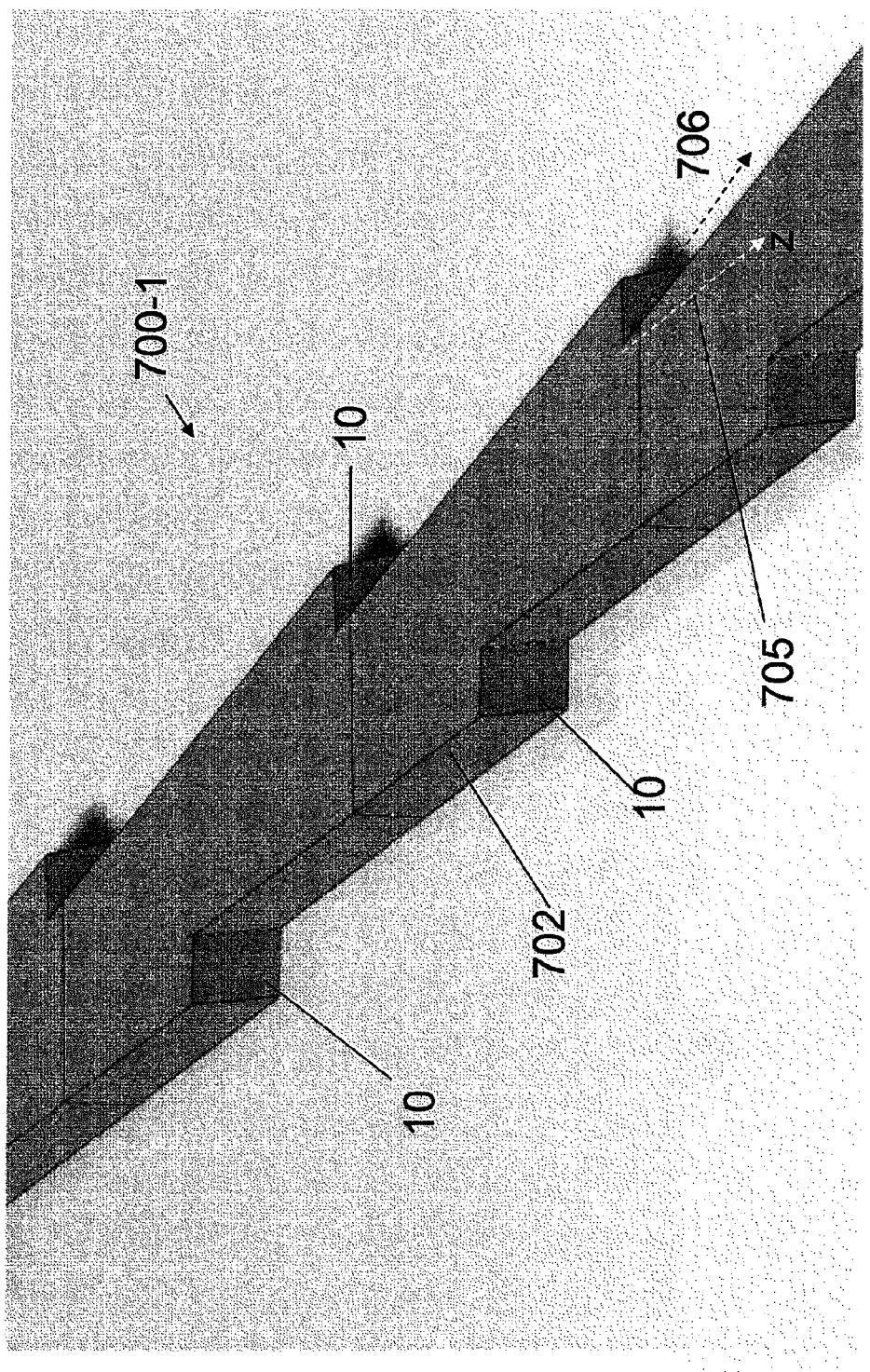
FIG. 7 shows a schematic perspective view of an alternate-type configuration dimple strip according to an exemplary aspect of the invention.
Figure 8:
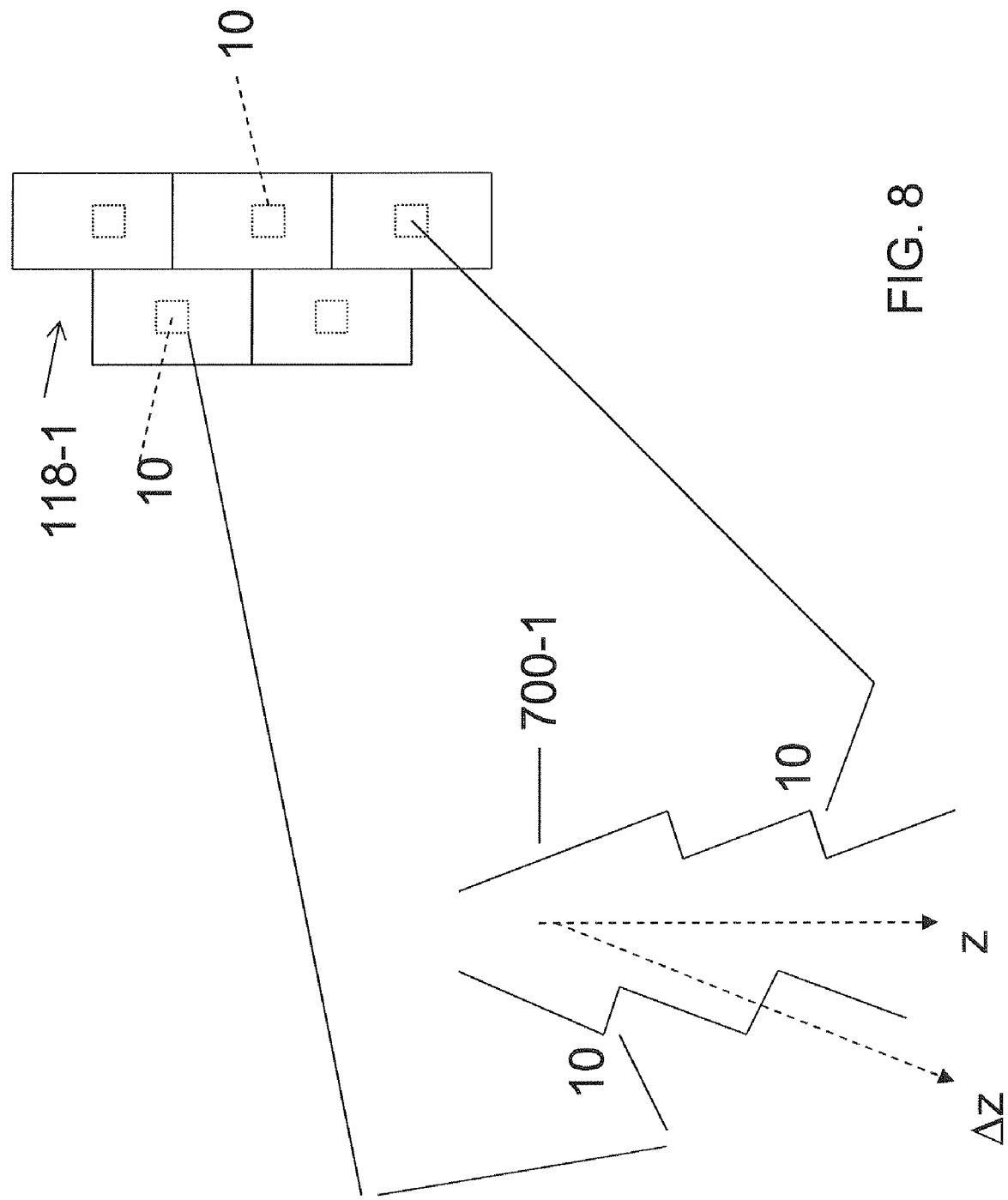
FIG. 8 further schematically illustrates the alternate-type configuration dimple strip shown in FIG. 7 associated with a tiled, primary light concentrator array, according to an exemplary aspect of the invention.

FIG. 7 shows a schematic perspective view of an alternate-type configuration dimple strip 700-1 according to an exemplary aspect of the invention. As illustrated, a linear plurality of dimples 10 are disposed on both sides of a strip 702. The white dotted arrow 705 represents the z-direction; the black dotted arrow 706 represents the rotated direction of the dimple, and the angle therebetween, Δz, is the rotation angle of the dimple. The rotation angle of each dimple (in this exemplary aspect set to 46.5°) shields each successive downstream facet from light reflected from each preceding facet. In this exemplary aspect, the dimples on opposite sides of the strip alternate in position relative to each other to correspond to a tiled or tessellated primary light concentrator array 118-1 as illustrated in FIG. 8; i.e., each facet or dimple is directly aligned with a respective mirror apex as illustrated in FIG. 5. The dimple features were combined into a long strip with injection facets on both sides and a slight wedge to shield each successive facet, as shown in FIG. 5. The strip geometry provides a top surface parallel to the guide plane, and thus any ray travelling down the guide that interacts with the top surface will not increase in propagation angle relative to the guiding direction. This also minimizes the shadowing loss, as light travelling through this flat region will not be deviated, and thus will still focus onto the injection feature. This geometry also maximizes secondary concentration possible at the end of the guide, as light propagating down the guide will only increase in angle defined by the guide plane. This yields a small angular spread in the angle perpendicular to the plane of the guide, and thus increases the possible secondary concentration.

The input numerical aperture perpendicular to the guiding direction is limited by the shadowing of the injection facets at higher angles. Having a larger input aperture in this dimension is advantageous, as it decreases the density of the injection features, and thus the lenslet aperture is also offset to decrease the shadowing of the injection face. The injection facet is rotated about the axis perpendicular to the guide plane so that it faces away from the prism structure. This minimizes the angles in the plane of the guide so that the light that is immediately deflected by the dimple has a lower initial propagation angle.

Figure 9:
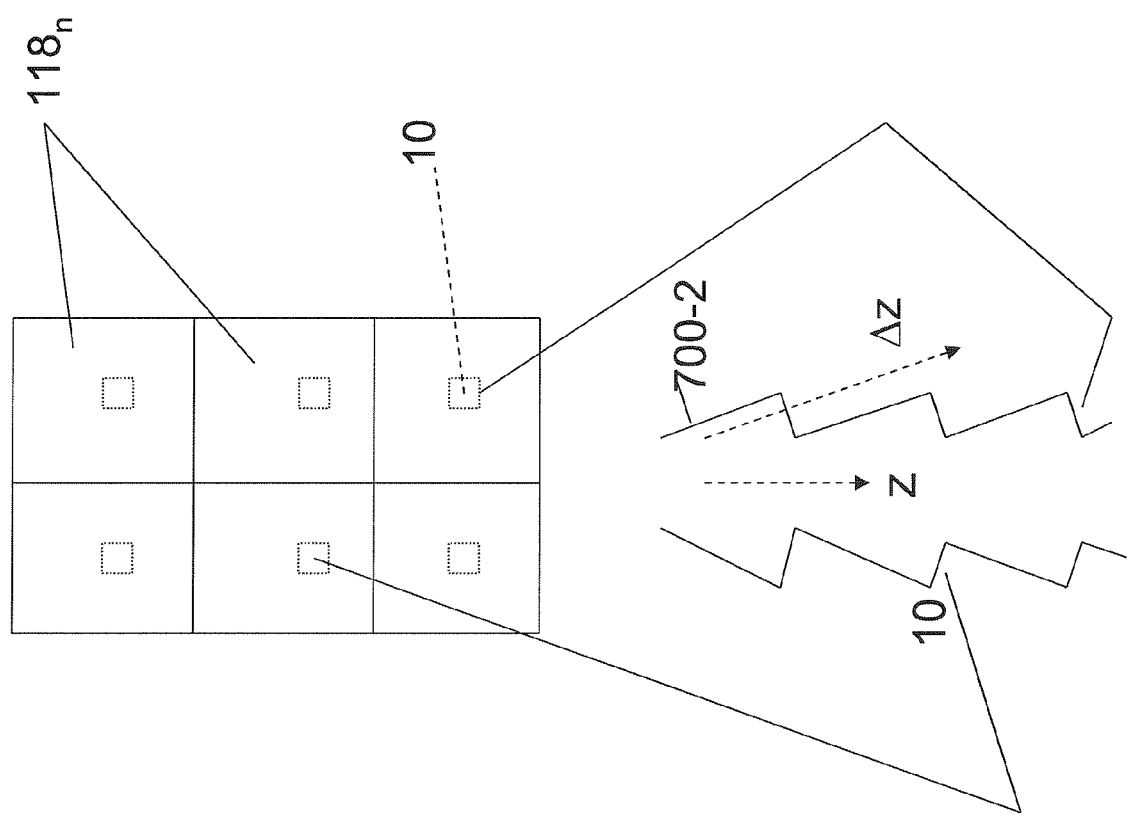
FIG. 9 schematically illustrates an opposite-type configuration dimple strip associated with a regular, aligned primary light concentrator array, according to an exemplary aspect of the invention.

FIG. 9 illustrated an alternative exemplary aspect of a dimple strip 700-2 in which the dimples 10 on opposing sides of the strip re opposite each other, thus this is referred to as an opposite-type dimple strip. In this aspect, the primary concentrator array 118 has an aligned and regular configuration as shown.

Figure 10:
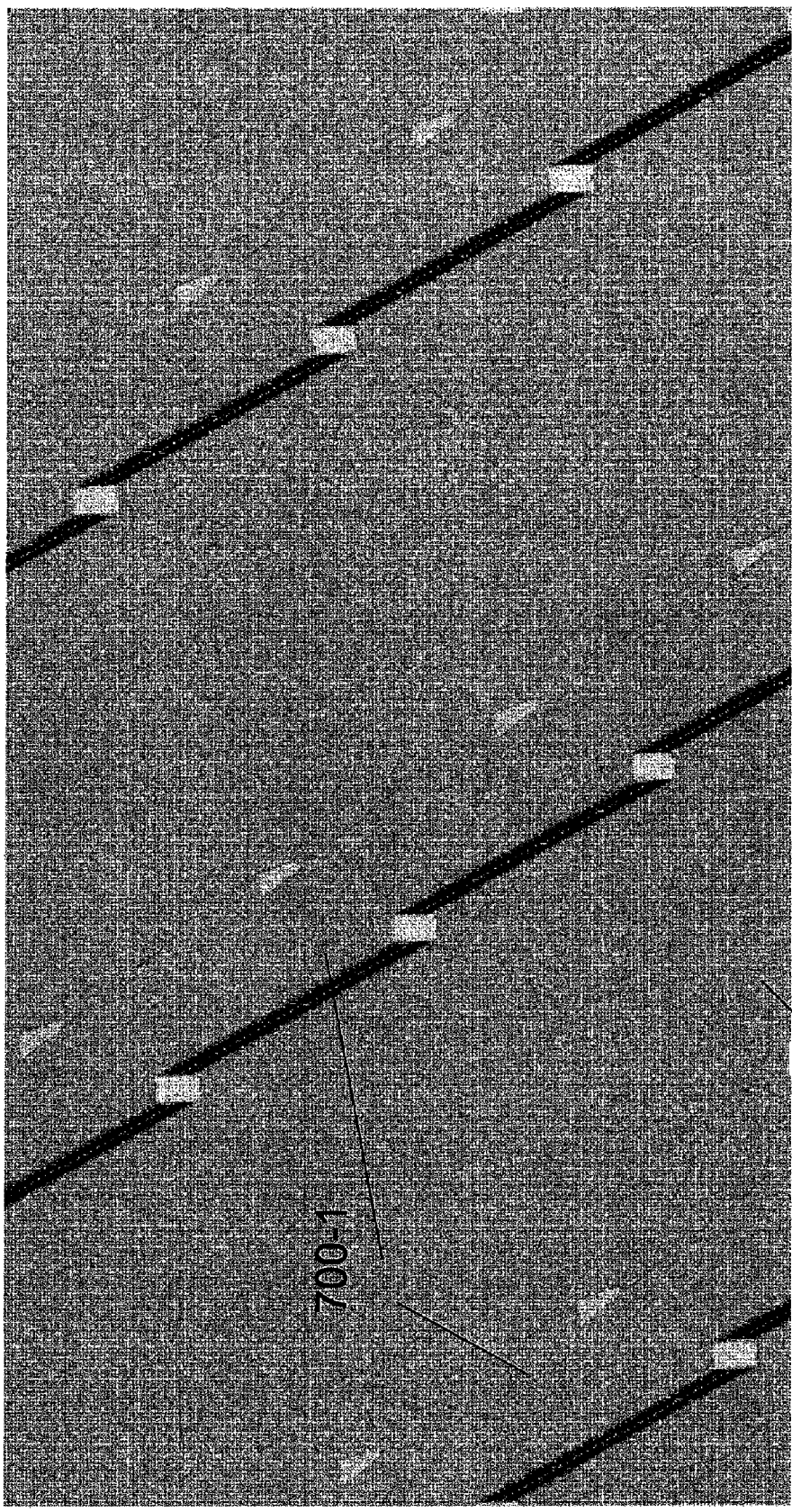
FIG. 10 schematically shows a dimple layer of the light guide layer, comprised of multiple, parallelly arranged alternating-type dimple strips, according to an exemplary aspect of the invention.

FIG. 10 illustrates a dimple layer 1001 which consists of a plurality of dimple strips 700-1 arranged parallel and in lengthwise (z-direction) orientation in the top surface of the light guide layer. As illustrated, the dimple strips are alternate-type dimple strips.

As described above, the light propagated in the guide layer is out-coupled at the exit end thereof. While the thickness, T (y-dimension), of the guide layer may be on the order of 3 mm-5 mm in an exemplary aspect, the width, W (x-dimension), of the guide layer need not be constrained except that the structure is intended to cumulatively concentrate all of the light input to the guide layer at the exit end for ultimate input to a PV cell. The limited entrance aperture of a PV cell located adjacent or immediately adjacent the exit end of the guide layer may benefit from further concentration of the propagating light, in which case a secondary concentrator between the exit end of the guide layer and the PV cell will be advantageous.

Figure 11:
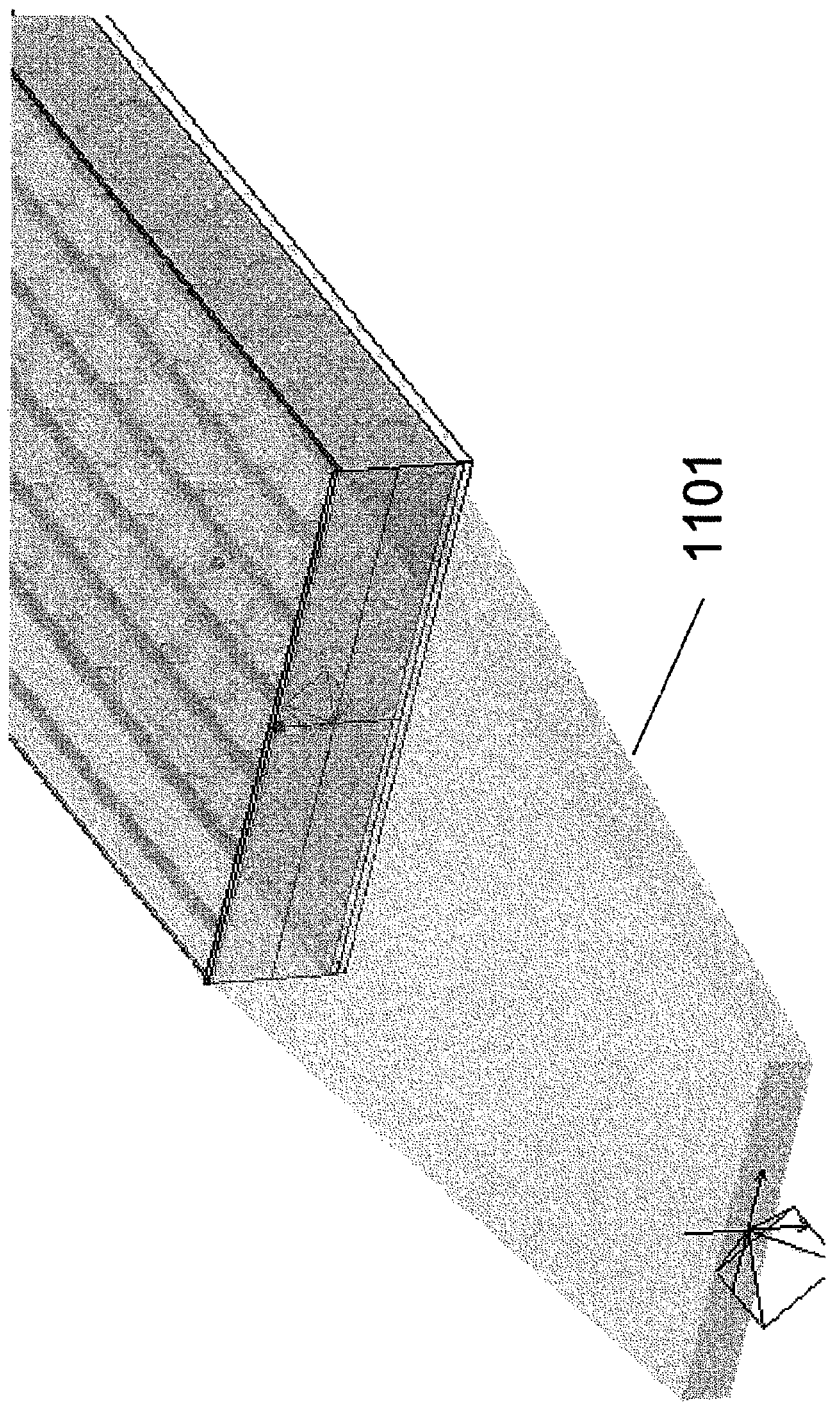
FIG. 11 schematically shows a flat-walled secondary concentrator coupled to the light guide apparatus, according to an exemplary aspect of the invention.

FIG. 11 schematically illustrate a flat-walled secondary concentrators 1101 coupled to the output edge of the light guide apparatus.

Modeled Performance

Figure 12:
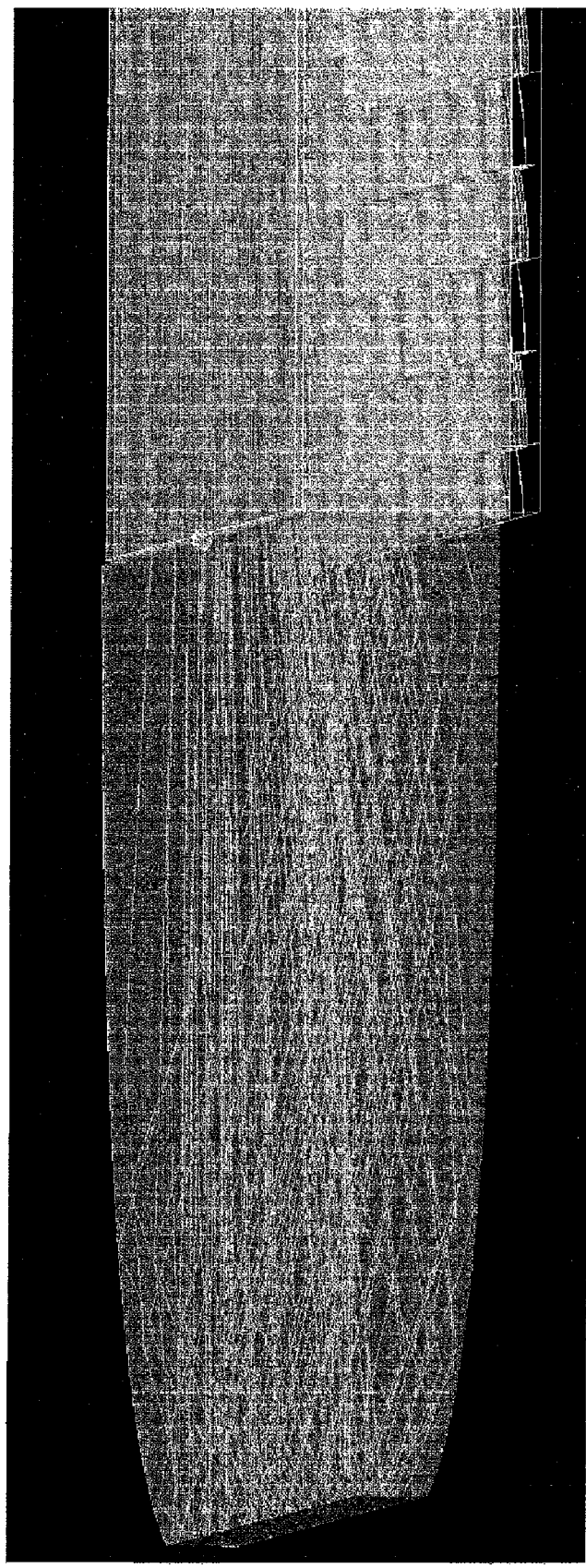
FIG. 12 illustrates a curved secondary concentrator according to an illustrative aspect of the invention.

An exemplary apparatus such as 100-1 illustrated in FIG. 3 was modeled using a light guide layer 101 of NBAK-1, a high index glass with high transmission. NBAK-1 has a refractive index of approximately 1.57, which will support TIR at incident angles of 50° or less. The dimple layer 10-1 and reflector layer 118-1 were modeled as also being NBAK-1, though for fabrication purposes they may advantageously be made out of an index matched silicone. The low index, TIR medium layer 121 was modeled to have a constant index of 1.38. A reflector element coating was modeled to be silver, with all other surfaces uncoated. A two millimeter guide layer 101 thickness was used, while the low index layer and dimple layer were modeled as being 127 and 125 μm thick, respectively. Light coming from the guide was further concentrated using a curved secondary concentrator 1201, as illustrated in FIG. 12. This was modeled to be a one dimensional concentrator extruded along the long dimension of the output face of the light guide, as several small two dimensional secondary concentrators were considered impractical for cost reasons. In order to account for imperfect tracking of the sun, the system was designed to have an acceptance angle of ±1 degree. These initial conditions were chosen to provide an approximate theoretical performance limit on this design form, while considering only realistic materials and providing realistic performance when mounted on a tracker.

Using this set of initial conditions, the shapes of the dimples 10 and microreflector array 118 were optimized to provide maximum efficiency at high concentrations. The optimum design parameters are listed in Table 1 above. Each injection face has a respective parabolic mirror 118$_n$ focusing light onto it. Each mirror extends 0.85 mm in the guiding direction as illustrated by D in FIG. 4(*a*). The geometric concentration at the output of the guide is 0.395 for each mirror element along the guiding direction.

Figure 13:
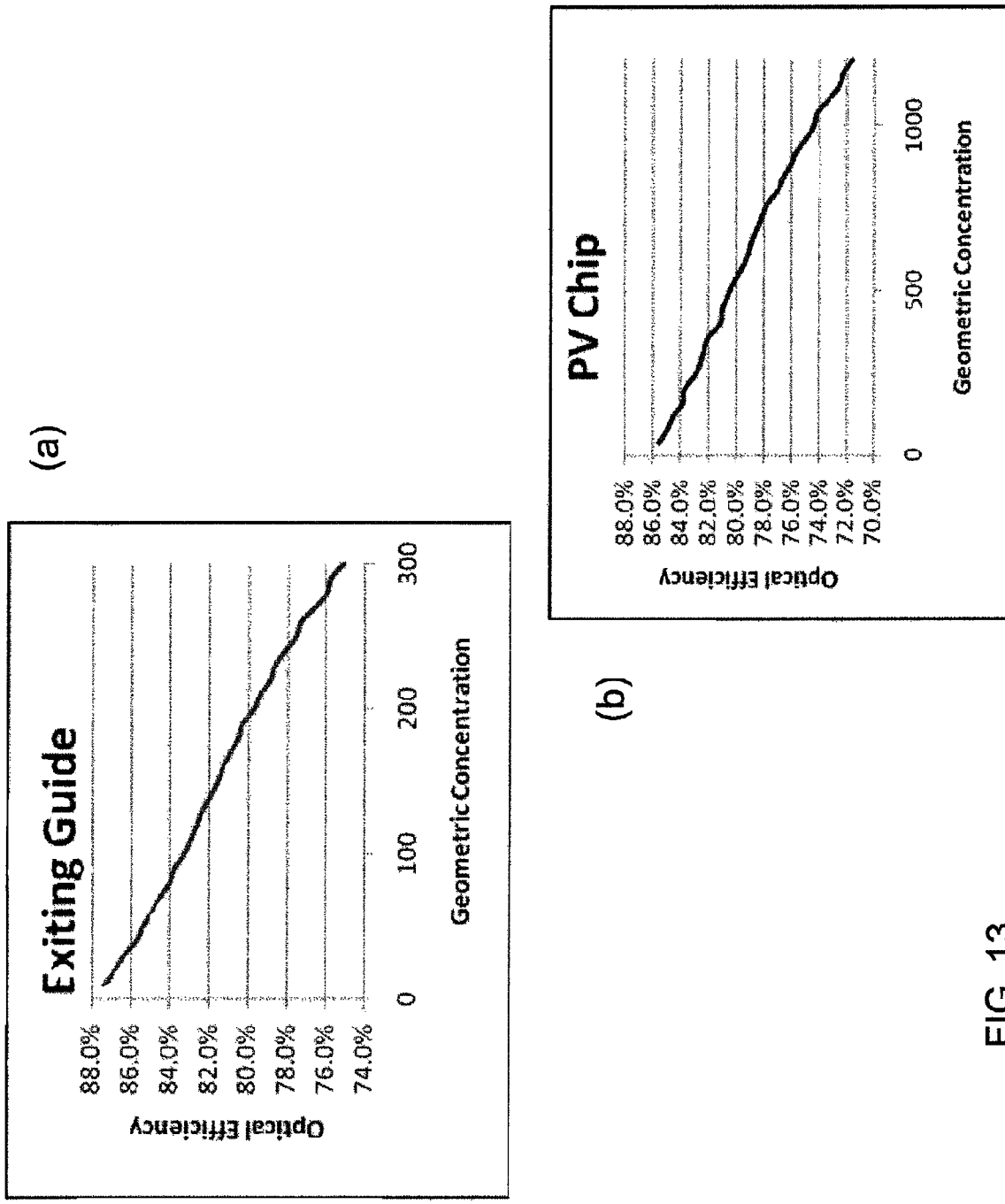
FIGS. 13(a, b) show efficiency curves of a modeled apparatus exiting the guide before secondary concentration (a) and arriving at the chip at the exit face of a secondary concentrator (b), according to an illustrative aspect of the invention.

The modeled apparatus was capable of achieving over 1000× geometric concentration while still having optical efficiencies well over 70%. As the apparatus increases in length along the guiding direction, the geometric concentration will increase, but the optical efficiency will decrease, as light injected farther from the PV chip suffers from absorption and ejection due to repeated interactions with the dimples. The modeled apparatus was 10 mm wide in the non-guiding direction, though the apparatus can be extended to much greater widths with similar performance. This design has a lower optical efficiency at concentrations below 50× relative to previous designs due to the minor and shadowing loss, but exhibits superior performance at higher concentrations. The optical efficiency of the apparatus as a function of geometric concentration is shown in FIGS. 13(*a*, *b*).

Manufacturing

The nominal design described above takes advantage of a high index glass to increase usable injection angles and to gain added concentration in the secondary concentrator. The low absorption of this glass also allows optimal performance at high concentrations. NBAK-1 is considered too expensive to be used in high volume production, thus a less expensive substitute may desirably be used. Borofloat glass is less expensive and has relatively high transmission, and thus offers a more advantageous commercial solution. Borofloat does not have the high transmission of NBAK-1, and the index of refraction is approximately 1.47, which is lower than NBAK-1. There is some variation on the transparency, index, and dispersion of borofloat based on manufacturer, but these were approximated with a Cauchy index profile ($A_0$=1.46, $A_1$=0.004), and a transmittance of 99.6% for every 10 mm of material.

Figure 14:
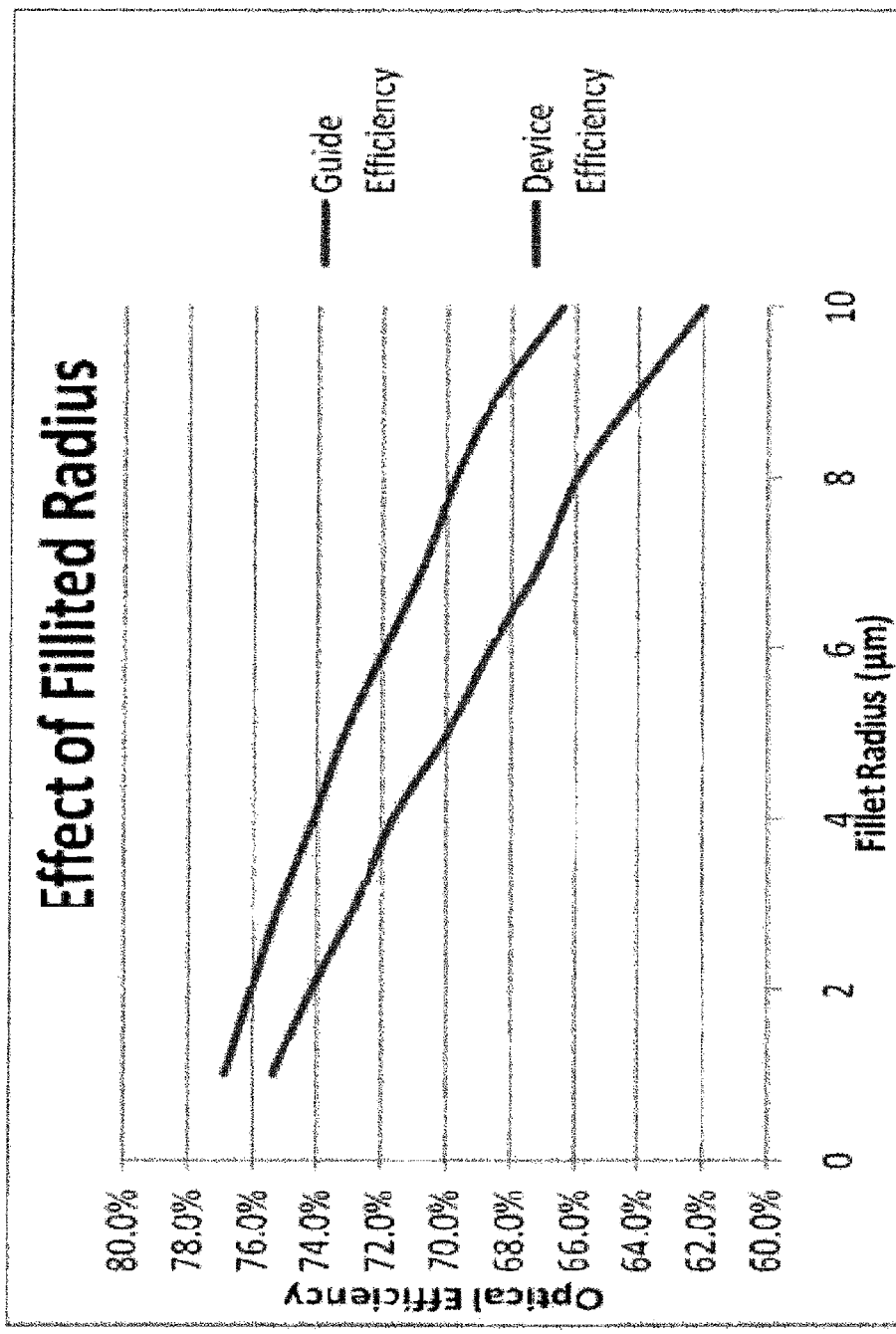
FIG. 14 is a graph showing the effects of fillet radii on device efficiency, according to an illustrative aspect of the invention.

The ideal system has very sharp features. The design described above had edges with a 1 μm fillet radius, which is too small for most production processes. Increased rounding of the features of the dimples will degrade performance in multiple ways. The fillets will increase shadowing loss, as any light incident on the device that passes through a fillet will not be refocused onto the injection facet. Increased fillet size will also require that the injection facet be larger, as the flat portion of the facet must maintain its size in order to keep the field of view required. This larger dimple and increased wedge will reduce the guiding efficiency, as interactions with the bypass elements will be more frequent and cause a larger deflection from the guiding direction. Finally, these rounded features will cause the light to spread into both dimensions as it propagates. The optimal design maintains the injection NA in one dimension, which allows maximum additional concentration in the secondary concentrator, and increasing the fillet radius will reduce the amount of possible secondary concentration. The effect of the fillets on the optical efficiency is shown in FIG. 14, where the concentrator is 450 mm long and has a geometric concentration of 800×.

Figure 15:
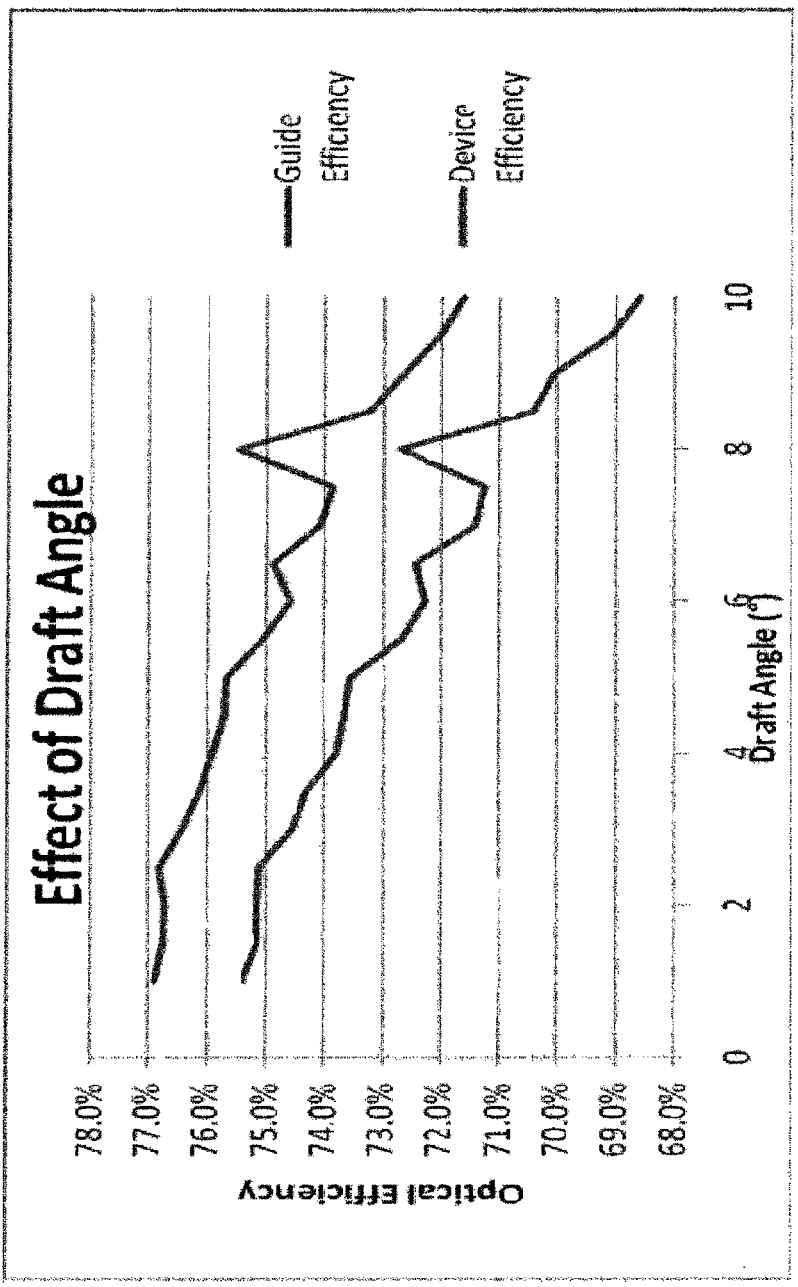
FIG. 15 is a graph showing the effects of draft angle on device performance, according to an illustrative aspect of the invention.

The steep side walls in the design are prohibitive for many manufacturing methods. Features that are too steep prevent the part from being released from a mold, and thus increasing the draft angles of the dimple features will increase manufacturability. When the side walls are no longer steep, they increase shadowing effects and spread propagating light into both directions, which reduces possible secondary concentration. The ideal system was modeled to have 1° draft angles, as a small draft actually increases performance. Small draft angles prevent light from being trapped in a channel between two strips of dimples and thus being ejected after a relatively short distance. The decrease in performance due to increased draft angles is shown in FIG. 15.

We determined that reasonable limits of manufacturing called for 10 μm fillets and draft angles no steeper than 10°. In previous prototypes, fillets designed to be smaller than 10 μm produced structures that were more rounded than the design called for, and these edges were also rough enough to produce a substantial amount of scattering. These previously fabricated designs also have shown that vertical walls with draft angles of less than 10° will have rough faces, and will be difficult to release from a mold. Fillets of this size and side walls with this draft angle have been achieved reliably, and designs adhering to these limitations can be produced reliably and have the smooth surfaces required for efficient guiding.

Figure 16:
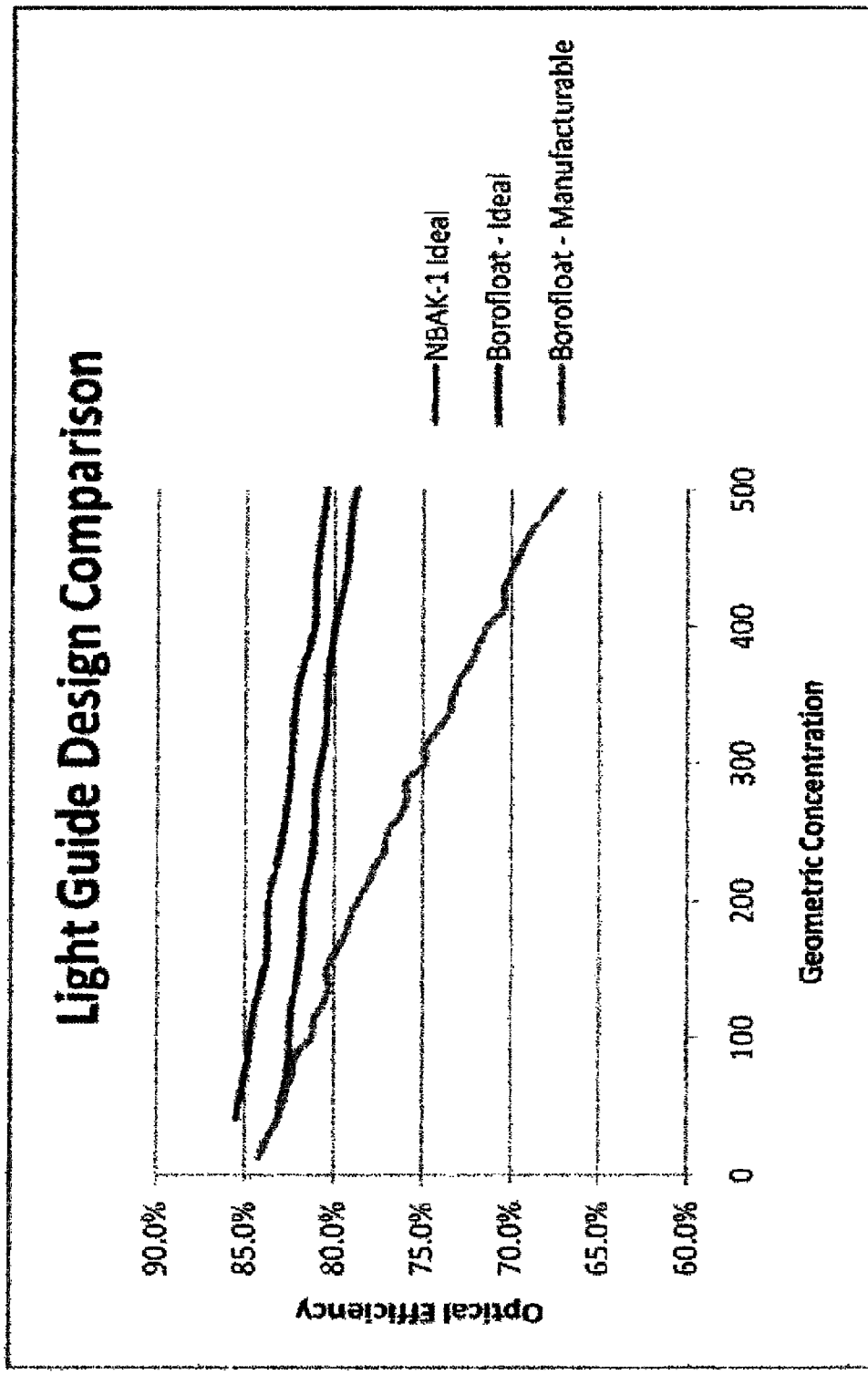
FIG. 16 is a graphical comparison of an ideal modeled design performance and the performance of the apparatus optimized for high volume production, according to an illustrative aspect of the invention.

The apparatus was re-optimized while maintaining these limitations in order to produce an apparatus that could feasibly be manufactured in large volume. The performance of this apparatus was substantially degraded from the originally modeled system, but was still capable of producing high geometric concentration at reasonable optical efficiencies. FIG. 16 provides a comparison of the ideal modeled design performance and the performance of the apparatus optimized for high volume production.

The ideal apparatus geometry is well suited for concentration of up to 1200×, but the design that has been altered to accommodate manufacturing tolerances is better suited to lower concentrations. The performance is most significantly reduced by the fillets of the dimples, though the increased draft angles also adversely affect performance. This design did achieve greater than 70% optical efficiency at over 400× geometric concentration. This design has taken into account the manufacturing limitations which cause the greatest adverse affect on the guide structure, and thus as-built performance should follow this modeling closely.

Previous manufacturing has shown that other factors that are not included in the current model, such as surface roughness and glass inhomogeneity, are not performance drivers, and thus should not cause a drastic deviation from the model discussed above. The curvature tolerance on the reflectors was determined to be a maximum departure of 1 μm at the edge of the aperture, but if the reflector layer thickness is adjusted, a sag error of 10 μm at the edge of the aperture could be compensated for without reducing system performance by more than 2%.

The embodied design can be adjusted to suit a particular application by changing the length of the guide along the guiding direction. A higher concentration can be achieved at the expense of optical efficiency. One version of the apparatus was 320 mm long along the guiding direction and achieved a geometric concentration of 430× with an optical efficiency of 70.1%. If higher efficiency is required and concentrations this high are not necessary, the device could be made shorter. An alternate version was 105 mm long along the guiding direction, achieving a geometric concentration of 150× with an optical efficiency of 80.7%. The apparatus can also be used without a secondary concentrator, which will reduce the geometric concentration, but also the manufacturing complexity. A system with no secondary concentrator that was 125 mm long can achieve a geometric concentration of 60× with an optical efficiency of 80.1%.

A light guide solar concentrator has been designed for high concentration applications while maintaining a high optical efficiency. The 1° field of view provides a reasonable tolerance for existing high end solar trackers. System performance of this ideal design would be competitive with existing systems, while providing many other advantages. The system has been modified to be more readily produced in high volumes to be cost competitive with existing systems using available manufacturing methods.

The apparatus may be further improved upon in many ways to more closely resemble the optimally designed performance. Finding a glass within the cost targets of the system that had a higher refractive index or increased transmission would increase performance closer to the level of the original NBAK-1 design. Any process of producing the dimples with high fidelity that more closely match the optimum design will also increase the achievable efficiency and concentration. Producing sharper edges and steeper side walls will increase the efficiency of the design as shown in the previous section.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. A light guide apparatus, comprising:
   a light guide layer having a top surface and a bottom surface, at least one of which is a substantially planar surface, and a transversely oriented side-end surface that forms an output aperture of the light guide, characterized by an index of refraction, $n_1$, further characterized by a length dimension in an intended light propagation direction towards the output aperture,
   where the intended light propagation direction is a z-axis direction of a Cartesian coordinate system; and
   a plurality of light injection elements disposed in the form of at least one linear strip in at least one of the top and bottom surfaces of the light guide layer,
   wherein some of the plurality of light injection elements are disposed on one lateral side of the strip and some other of the plurality of light injection elements are disposed on an opposing lateral side of the strip,
   further wherein each light injection element is disposed outwardly at a rotation angle $\Delta z$ about the y-axis.

2. The light guide apparatus of claim 1, further comprising a plurality of strips of light injection elements disposed in parallel relation to one another.

3. The light guide apparatus of claim 1, wherein the some of the plurality of light injection elements disposed on the one lateral side of the strip and the some other of the plurality of light injection elements disposed on the opposing lateral side of the strip are opposite in relationship.

4. The light guide apparatus of claim 1, wherein the some of the plurality of light injection elements disposed on the one lateral side of the strip and the some other of the plurality of light injection elements disposed on the opposing lateral side of the strip are alternate in relationship.

5. The light guide apparatus of claim 1, further comprising a total internal reflection (TIR) medium layer disposed immediately adjacent at least one of the top and bottom surfaces of the light guide layer, characterized by an index of refraction, $n_2$, where $n_2$ is less than $n_1$.

6. The light guide apparatus of claim 5, further comprising a primary light concentrator array disposed adjacent the light guide layer, wherein the primary light concentrator array includes a plurality of primary concentrator elements each of which is in optical registration with a respective one of the light injection elements.

7. The light guide apparatus of claim 6, wherein the primary light concentrator array is disposed adjacent the bottom surface of the light guide layer and the plurality of light injection elements are disposed in the top surface of the light guide layer.

8. The light guide apparatus of claim 6, wherein each of the primary concentrator elements is a parabolic mirror.

9. The light guide apparatus of claim 8, wherein each of the primary concentrator elements is offset such that its optical axis is not centered in the input aperture of the element.

10. The light guide apparatus of claim 9, wherein the primary light concentrator array is in the form of a tessellated array.

11. The light guide apparatus of claim 9, wherein each of the primary concentrator elements has an apex that is aligned directly over a respective light injection element.

12. The light guide apparatus of claim 1, wherein each of the light injection elements are disposed at an injection angle greater than 45 degrees.

13. The light guide apparatus of claim 1, wherein the rotation angle $\Delta z$ of each of the light injection elements is between five to 10 degrees.

14. The light guide apparatus of claim 13, wherein the rotation angle $\Delta z$ of each of the light injection elements is eight degrees.

* * * * *